United States Patent
Gitlin et al.

[11] Patent Number: 5,870,327
[45] Date of Patent: Feb. 9, 1999

[54] MIXED MODE RAM/ROM CELL USING ANTIFUSES

[75] Inventors: Daniel Gitlin, Sunnyvale; Dennis L. Segers, Ben Lomand; Michael J. Hart, Palo Alto, all of Calif.

[73] Assignee: Xilinx, Inc., San Jose, Calif.

[21] Appl. No.: 963,532

[22] Filed: Nov. 3, 1997

Related U.S. Application Data

[63] Continuation of Ser. No. 684,364, Jul. 19, 1996, abandoned.

[51] Int. Cl.$^6$ ..................................................... G11C 17/00
[52] U.S. Cl. ........................................... 365/96; 365/225.7
[58] Field of Search ..................................... 365/96, 225.7

[56] References Cited

U.S. PATENT DOCUMENTS

| | | | |
|---|---|---|---|
| Re. 34,363 | 8/1993 | Freeman | 307/465 |
| 4,750,155 | 6/1988 | Hsieh | 365/203 |
| 5,110,754 | 5/1992 | Lowrey et al. | 437/52 |
| 5,200,652 | 4/1993 | Lee | 307/465 |
| 5,426,614 | 6/1995 | Harward | 365/96 |
| 5,475,253 | 12/1995 | Look et al. | 257/530 |
| 5,486,707 | 1/1996 | Look et al. | 257/52 |
| 5,495,436 | 2/1996 | Callahan | 365/96 |
| 5,581,505 | 12/1996 | Lee | 365/96 |

OTHER PUBLICATIONS

Betty Prince, "Semiconductor Memories", copyright 1983, 1991, John Wiley & Sons, pp. 151, 157–160, 163–165.

*Primary Examiner*—Son T. Dinh
*Attorney, Agent, or Firm*—Jeanette S. Harms

[57] ABSTRACT

A mixed mode RAM/ROM cell includes a volatile memory cell and an antifuse coupled to the cell. In an array of mixed mode memory cells, addressing circuitry is coupled to the volatile memory cells and programming circuitry is coupled to the antifuses. After an antifuse is programmed, the associated memory cell is transformed from a volatile memory to a non-volatile memory. Specifically, during normal operation, a standard supply voltage is provided to all antifuses. Thus, after a power down or power fluctuation, the programmed antifuses ensure subsequent configuration of their respective volatile memory cells.

5 Claims, 2 Drawing Sheets

5,870,327

MIXED MODE RAM/ROM CELL USING ANTIFUSES

This application is a continuation of application Ser. No. 08/684,364, filed Jul. 19, 1996, now abandoned.

BACKGROUND OF THE INVENTION

1. Field of the Invention

The present invention relates to random access memory (RAM) cells and read only memory (ROM) cells, and particularly to mixed mode RAM/ROM cells using antifuses.

2. Description of the Related Art

Random access memory (RAM) cells and read only memory (ROM) cells are well known in the art. A RAM cell stores a logic state, i.e. a logic one or a logic zero, and needs a constant DC voltage to maintain its configuration. Thus, a RAM cell can be reprogrammed by turning the power off, thereby providing design flexibility. A ROM cell also stores a logic state, but is non-volatile, i.e. retains its logic state even in the absence of DC voltage. Thus, ROM cells provide protection against power loss, but fail to provide design flexibility. Therefore, a need arises for a memory cell having the design flexibility of a RAM cell as well as the non-volatility capability of a ROM cell.

SUMMARY OF THE INVENTION

In accordance with the present invention, a memory cell includes a volatile memory cell and an antifuse coupled to the volatile memory cell at a node. In a distributed group of memory cells in accordance with the present invention, conventional addressing circuitry is coupled to the volatile memory cells and conventional programming circuitry is coupled to the antifuses. In typical embodiments, the volatile memory cell includes either a 5-T or 6-T static RAM (hereinafter SRAM) cell.

In a single cell programming method, the SRAM cells of an array are configured in a conventional manner to provide high voltages on the nodes. Then, the SRAM cell of the memory cell to be permanently programmed is configured to store a low voltage on the node. Finally, a programming voltage pulse is provided to the antifuses of the memory cells, wherein the antifuse of the memory cell to be programmed sees the full programming voltage across its terminals, thereby programming that antifuse. All other antifuses in the distributed group of memory cells see less than a full programming voltage across their terminals and therefore do not program.

In accordance with the present invention, once an antifuse is programmed, the associated memory cell is transformed from a volatile memory to a non-volatile memory. Specifically, during normal operation, a standard supply voltage is provided to all antifuses. Thus, after a power down or power fluctuation, the programmed antifuses ensure subsequent configuration of their respective SRAM cells.

In a parallel programming method, a plurality of memory cells in the present invention are programmed simultaneously. In this operation, the SRAM cells of the array are configured in a conventional manner to store the appropriate logic states for a desired configuration (the configuration bit pattern). Then, a programming voltage is provided as a pulse to all antifuses. The antifuses associated with the SRAM cells storing low voltages on the nodes will program, whereas the antifuses associated with the RAM cells storing high voltages on the nodes will not program. After antifuse programming, all SRAM cells are re-configured by writing zeros into the nodes coupled to the antifuses. Transferring to a normal (i.e. read) operation, the programming circuitry provides a high voltage to the antifuses. In this manner, the programmed antifuses flip the state of their respective SRAM cells. Thus, the original configuration bit pattern is recovered fully, but in inverted form. This inversion is compensated for using any conventional method.

Typically, programmable logic devices, such as field programmable gate arrays (FPGAs), use off-chip devices, such as EPROMs, to store configuration bits. In the present invention, these bits can be stored on chip by including the above-described antifuses, thereby maintaining a device configuration irrespective of power outages or fluctuations.

In one embodiment of the present invention, a metal to metal antifuse is placed on top of each SRAM cell, thereby providing a high density memory array. Moreover, because an antifuse in this embodiment is a metal to metal device, the leakage current in its unprogrammed state is very low. Thus, even at high densities, the memory cells of the present invention ensure minimal leakage currents.

DETAILED DESCRIPTION OF THE DRAWINGS

Figure 1A:
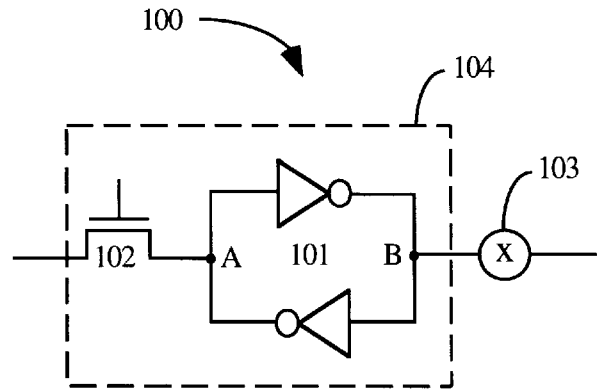
FIGS. 1A, 1B, and 1C illustrate memory cells in accordance with the present invention.

FIG. 1A illustrates one embodiment of a memory cell 100 in accordance with the present invention. In this embodiment, memory cell 100 includes a latch 101 and an access transistor 102 at node A. This latch/access transistor configuration (known in the industry as a 5-T static RAM (SRAM) cell, and hereinafter referenced as SRAM cell 104) is explained in greater detail in U.S. Pat. No. 4,750,155, assigned to Xilinx, Inc., and is incorporated by reference herein.

In accordance with the present invention, memory cell 100 includes an antifuse 103 coupled to node B of SRAM cell 104. An antifuse is non-conductive when manufactured, but becomes permanently conductive after applying a predetermined voltage across its terminals. Examples of illustrative antifuses and their operation are found in U.S. Pat. Nos. 5,475,253 and 5,486,707 which are incorporated herein by reference. Note that the present invention is not limited to these illustrative antifuses and other antifuse configurations may be used for antifuse 103.

Figure 1B:
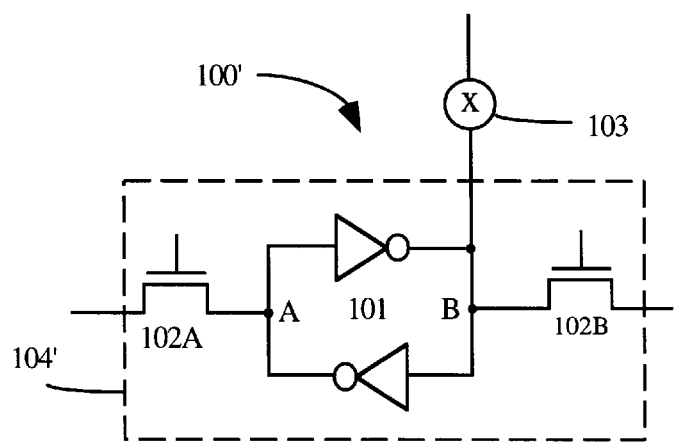
Figure 1C:
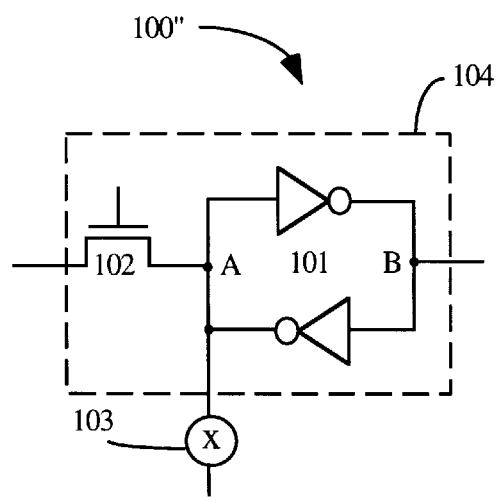

FIG. 1B shows another embodiment of a memory cell 100' in accordance with the present invention. In this embodiment, memory cell 100' includes two access transistors 102A and 102B as well as latch 101, thereby forming a conventional 6-T SRAM cell (SRAM cell 104'). Basic operation of SRAM cell 104' is well known in the art and is described, for example, in *Semiconductor Memories*, B. Prince, 157–160, 1991, which is incorporated herein by reference. FIG. 1C shows yet another embodiment of a memory cell 100" in accordance with the present invention. In this embodiment, memory cell 100" includes antifuse 103 and access transistor 102 coupled to node A.

Figure 2:
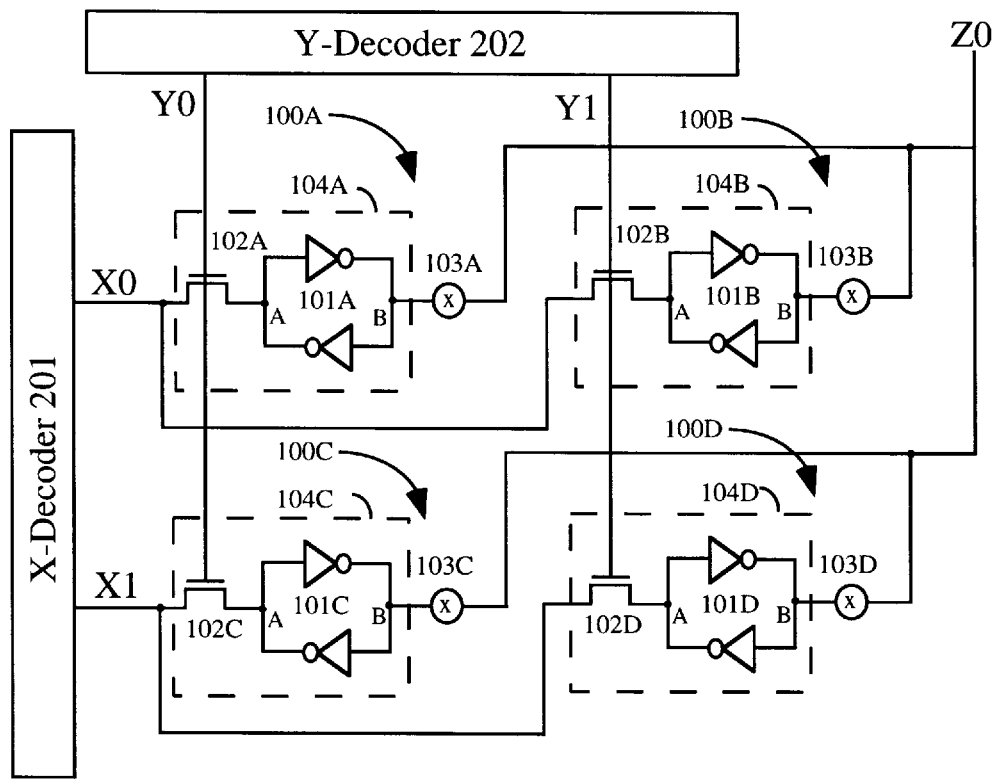
FIG. 2 shows one embodiment of a memory cell array in accordance with the present invention.

FIG. 2 shows a distributed group (in this case a 2×2 array) of memory cells 100A–100D in accordance with the present invention coupled to a Y-decoder 202 (for addressing the memory cells in a column via lines Y0 or Y1) and an X-decoder 201 (for addressing the memory cells in a row via lines X0 or X1). Note that X-decoder 201 and Y-decoder 202, in this embodiment, include standard decoder circuitry and thus are not described in detail herein. In the embodiment shown in FIG. 2, one terminal of each antifuse 103A–103D is coupled to a common line Z0 (wherein, as noted previously, the other terminal is coupled to node B of the associated SRAM cell 104). For simplicity, the array shown in FIG. 2 includes SRAMs 104; however, those skilled in the art will recognize that either SRAMs 104' or SRAMs 104" can be substituted for any embodiments using SRAMs 104.

Single Memory Cell Programming

To permanently program a single memory cell in the distributed group shown in FIG. 2, SRAM cells 104A–104D are configured in a conventional manner to provide low voltages on nodes A and high voltages on nodes B. Specifically, Y-decoder 202 provides a high voltage Vdd on lines Y0 and Y1, thereby turning on access transistors 102A–102D. In one embodiment, voltage Vdd is the supply voltage of 5 volts. X-decoder 210 then outputs a low voltage Vss on lines X0 and X1, thereby providing a low voltage on all nodes A of SRAM cells 104A–104D. In one embodiment, voltage Vss is ground, i.e. zero volts. Latches 101A–101D invert the low signals on nodes A and provide a high signal on all nodes B of SRAM cells 104A–104D.

To permanently program a particular antifuse, for example antifuse 103A, Y-decoder 202 provides a high voltage Vdd via address line Y0 to the gates of access transistors 102A and 102C associated with memory cells 100A and 100C, respectively, thereby turning on those access transistors. Simultaneously, Y-decoder 202 provides a zero voltage via address line Y1 to the gates of access transistors 102B and 102D associated with memory cells 100B and 100D, respectively, thereby turning off those access transistors. Then, X-decoder 201 applies voltage Vdd on address line X0 and voltage Vss on address line X1. In this manner, latches 101B, 101C, and 101D each store zero volts on node A and 5 volts on node B, whereas latch 101A has 5 volts on node A and zero volts on node B. In one embodiment, X-decoder 201 and Y-decoder 202 are then disabled to program the designated memory cell.

Figure 3:
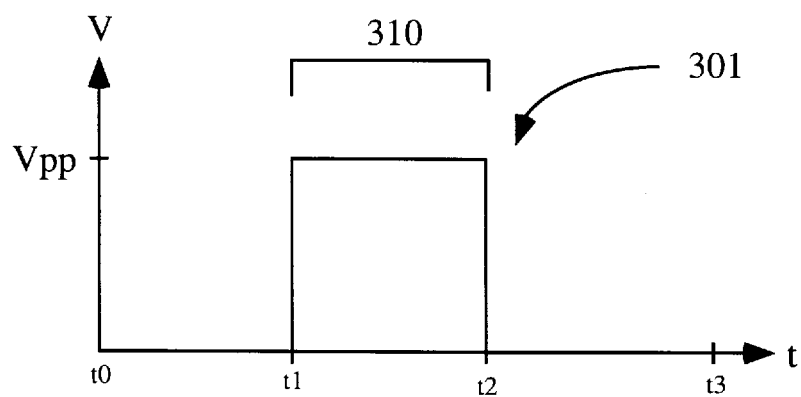
FIG. 3 illustrates the programming pulse associated with the programming of a memory cell in accordance with the present invention.

FIG. 3 illustrates a waveform 301 associated with programming of a memory cell in accordance with the present invention. Specifically, waveform 301 shows the voltage on common line Z0 which varies during programming between zero volts and programming voltage Vpp. (Note that common line Z0 is coupled to conventional programming circuitry which is not described in detail herein.) During time t0–t1, the voltage seen by antifuse 103A is zero. Thus, antifuse 103A remains unprogrammed. However, during time t1–t2, the voltage on common line Z0 is increased to voltage Vpp (creating a programming pulse 310). In typical embodiments, programming voltage Vpp is approximately 10–12V and the period of programming pulse 310 is between 1–100 milliseconds. (Note that any programming pulse 310 sufficient to program an antifuse 103 may be used in accordance with the present invention. Thus, the actual voltage, the period, and the type of waveform vary in different embodiments.)

Because zero volts is stored on node B of SRAM cell 104A, antifuse 103A sees a full programming voltage Vpp across its terminals, thereby programming that antifuse. A programmed antifuse has a low resistance, i.e. a lower resistance than the pull-down transistor (not shown for simplicity) of the SRAM cell 104 connected to node B, and therefore is conductive. Thus, during time t1–t3, the stored voltage on node B of SRAM cell 104A changes from zero to a high voltage, thereby causing the stored voltage on node A to change from a high voltage to zero (in other words, SRAM cell 104A flips state).

In contrast to SRAM cell 104A, SRAM cells 104B, 104C, and 104D have voltage Vdd stored on their respective nodes B. Thus, the voltages across antifuses 103B, 103C, and 103D during time t1–t2 is Vpp–Vdd which is ineffective in programming those antifuses. Therefore, using the above-described programming method, only one antifuse, i.e. antifuse 103A, is programmed.

In accordance with the present invention, once an antifuse 103 is programmed, memory cell 100 is transformed from a volatile memory to a non-volatile memory. Specifically, during normal operation, a standard supply voltage Vdd is provided on common line Z0. Thus, after a power down condition, all programmed antifuses ensure subsequent programming of their respective SRAMs (i.e. a low voltage on node A and a high voltage on node B).

Parallel Memory Cell Programming

In a second programming method, a plurality of memory cells 100 are programmed in parallel. In this operation, SRAM cells 104 are configured in a conventional manner to store the logic states desired in the configuration (referred to as the configuration bit pattern). Additional information regarding the programming of memory cells to store a configuration bit pattern is provided in U.S. Pat. No. Re. 34,363 and U.S. patent Ser. No. 08/642,758, which are incorporated by reference herein. In accordance with one embodiment of the present invention, X-decoder 201 and Y-decoder 202 are disabled, thereby allowing all memory cells 100 to float. Then, programming voltage Vpp is provided as a pulse on common line Z0. As explained in detail above in reference to FIGS. 2 and 3, the antifuses 103 associated with SRAM cells 104 storing a low voltage on node B will program, whereas the antifuses 103 associated with SRAM cells 104 storing a high voltage on node B will not program. Finally, the voltages on all address lines (for example, lines X0, X1, Y0, and Y1 of FIG. 2) are brought high, thereby writing zeros to nodes B of SRAM cells 104. Transferring to a normal (i.e. read) operation, the voltage on common line Z0 is returned to voltage Vdd. Subsequently, all programmed antifuses 103 flip the state of their respective SRAM cells 104. In this manner, the original configuration bit pattern is recovered fully, but in inverted form. This inversion is compensated for using any conventional manner.

Note that the read mode of the distributed group of memory cells in accordance with the present invention is implemented using conventional methods and therefore is not described in detail herein. Additional information regarding the read mode is provided in *Semiconductor Memories*, B. Prince, 151, 157–160, and 163–165.

Typically, programmable logic devices, such as field programmable gate arrays (FPGAs), use off-chip devices, such as EPROMs, to store the bits for the configuration bit pattern. In the present invention, these bits can be provided on chip by including programmed antifuses 104, thereby maintaining a device configuration irrespective of power outages or fluctuations.

Memory Cell Fabrication

In one embodiment of the present invention, a metal to metal antifuse is placed on top of each SRAM cell. Such placement is described, for example, in U.S. Pat. No. 5,786,240 which issued Jul. 28, 1998 entitled "OVER- ETCHING TO IMPROVE VOLTAGE DISTRIBUTION", which is incorporated by reference herein. This fabrication requires one extra layer of metal, but does not increase silicon area for the array, thereby providing a high density memory array. Moreover, because the antifuse in this embodiment is a metal to metal device, the leakage current in its unprogrammed state is very low, i.e. on the order of one nanoamp. Thus, even at high densities, the memory cells of the present invention ensure minimal leakage currents.

The above description of the present invention is meant to be illustrative only and not limiting. For example, in the above-described embodiments, a positive programming pulse is used to program the antifuses. However, in other embodiments, a negative pulse is used. Other embodiments will be apparent to those skilled in the art in light of the detailed description. The present invention is set forth in the appended claims.

We claim:

1. A memory device comprising:
    a latch having a first and a second inverter, each inverter having an input and an output terminal, wherein the input terminal of said first inverter is coupled to the output terminal of said second inverter, thereby forming a first node, and wherein the input terminal of said second inverter is coupled to the output terminal of said first inverter, thereby forming a second node;
    an access transistor coupled to said first node;
    one and only one antifuse, wherein said antifuse has a first terminal and a second terminal, wherein said first terminal of said antifuse is coupled to one of said first node and said second node; and
    programming circuitry coupled to said second terminal of said antifuse.

2. A memory device comprising:
    a volatile memory cell;
    one and only one antifuse, wherein said antifuse has a first terminal and a second terminal, wherein said first terminal of said antifuse is coupled to said volatile memory cell; and
    programming circuitry coupled to said second terminal of said antifuse.

3. A device including a distributed group of memory cells, said device comprising:
    a plurality of memory cells, wherein at least one memory cell includes:
        a latch including a first and a second inverter, each inverter having an input and an output terminal, wherein the input terminal of said first inverter is coupled to the output terminal of said second inverter, thereby forming a first node, and wherein the input terminal of said second inverter is coupled to the output terminal of said first inverter, thereby forming a second node;
        an access transistor coupled to said first node;
        one and only one antifuse in each memory cell, wherein said antifuse has a first terminal and a second terminal, wherein said first terminal of said antifuse is coupled to one of said first node and said second node; addressing circuitry coupled to said access transistor; and programming circuitry coupled to said second terminal of said antifuse.

4. A device including a distributed group of memory cells, said device comprising:
    a plurality of memory cells, wherein at least one memory cell includes:
        a volatile memory cell including at least one access transistor; and
        one and only one antifuse, wherein said antifuse has a first terminal and a second terminal, wherein said first terminal of said antifuse is coupled to said volatile memory cell;
    addressing circuitry coupled to said at least one access transistor; and
    programming circuitry coupled to said second terminal of said antifuse.

5. A method of programming a plurality of memory cells in a memory cell array, wherein each memory cell comprises a volatile memory cell and one and only one antifuse, wherein said antifuse is coupled to said volatile memory cell at a node, wherein said programming method comprises:
    (a) latching a plurality of configuration bits into said volatile memory cells;
    (b) providing a programming voltage pulse to said antifuses; and
    (c) writing logic zeros to said nodes.

* * * * *